United States Patent [19]

Gries

[11] Patent Number: 5,725,991
[45] Date of Patent: Mar. 10, 1998

[54] PHOTOSENSITIVE MATERIAL AND METHOD OF PRODUCING OFFSET PRINTING PLATES

[75] Inventor: Willi-Kurt Gries, Wiesbaden, Germany

[73] Assignee: AGFA-Gevaert AG, Leverkusen, Germany

[21] Appl. No.: 733,917

[22] Filed: Oct. 18, 1996

Related U.S. Application Data

[63] Continuation of Ser. No. 423,851, Apr. 18, 1995, abandoned.

[30] Foreign Application Priority Data

May 4, 1994 [DE] Germany ............... 44 15 607.3

[51] Int. Cl.$^6$ ............... G03F 7/032; G03F 7/34
[52] U.S. Cl. ............... 430/258; 430/278.1; 430/260; 430/261
[58] Field of Search ............... 430/278.1, 260, 430/261, 258

[56] References Cited

U.S. PATENT DOCUMENTS

| | | | |
|---|---|---|---|
| 4,175,964 | 11/1979 | Uchida et al. | 430/253 |
| 4,349,620 | 9/1982 | Cyr et al. | 430/259 |
| 4,895,787 | 1/1990 | Platzer | 430/253 |

FOREIGN PATENT DOCUMENTS

| | | |
|---|---|---|
| 487260 | 11/1991 | European Pat. Off. . |
| 486793 | 5/1992 | European Pat. Off. . |
| 0 514 186 | 11/1992 | European Pat. Off. . |
| 0 530 674 | 3/1993 | European Pat. Off. . |
| 650094 | 4/1995 | European Pat. Off. . |
| 1 090 663 | 11/1967 | United Kingdom . |
| 93/05446 | 3/1993 | WIPO . |

*Primary Examiner*—Cynthia Hamilton
*Attorney, Agent, or Firm*—Foley & Lardner

[57] ABSTRACT

A photosensitive material for the production of offset printing plates which contains a) a coating base which is composed of aluminum or an aluminum alloy and is suitable for offset printing, b) a hydrophilic coating containing an organic polymer and a free-radical-polymerizable compound and having a coating weight in the range from 0.001 to 1 g/m$^2$, c) a photopolymerizable coating containing (1) a polymeric binder, (2) a free-radical-polymerizable compound and (3) a compound or a combination of compounds which is capable of initiating the polymerization of the compound (2) on exposure to actinic radiation, and d) a transparent covering sheet, the adhesion of the photopolymerizable coating (c) to the hydrophilic coating (b) and/or the covering sheet (d) being altered by exposure. The material is processed to form the printing plate by imagewise exposure and peeling the covering sheet (d) together with the unexposed areas of the coating (c) off the coating base (a) ("peel apart"). Printing plates having good resolution and high run performance are obtained.

14 Claims, No Drawings

PHOTOSENSITIVE MATERIAL AND METHOD OF PRODUCING OFFSET PRINTING PLATES

This application is a continuation of application Ser. No. 08/423,851, filed Apr. 18, 1995, now abandoned.

BACKGROUND OF THE INVENTION

1. Field of the Invention

The invention relates to a photosensitive material which is suitable for the production of offset printing plates and contains, a) a coating base suitable for offset printing plates, b) a hydrophilic coating, c) a photopolymerizable coating, and d) a transparent covering sheet.

It furthermore relates to a method of producing offset printing plates, in which a material of the generic type specified above is imagewise exposed and developed by mechanically peeling ("peel-apart" technique) the transparent covering sheet, together with the unexposed areas of the coating (c) from the coating base (a).

Materials and methods of this type have the important advantage that they do not require for their processing any developer solutions which have to be disposed of in an environmentally harmless way. During the exposure, the adhesion of the photopolymerizable coating changes with respect to the coatings adjacent to it so that when the covering sheet and the coating base are pulled apart, the exposed coating areas adhere to one side and the unexposed ones to the other side.

2. Description of Related Art

DE-C 15 72 122 describes a method of producing images, in which a material composed of a transparent sheet, a photopolymerizable coating and a second sheet is imagewise exposed and developed to form a negative and a positive image by pulling the sheet apart.

EP-A 514 186 and U.S. Pat. No. 4,895,787 describe similar photopolymerizable materials which can be processed by peel-apart development and which are used to produce color-proof sheets.

The publications mentioned above describe materials in which a colorless or colored photopolymerizable coating is disposed between two sheets adapted for the particular application purpose. If necessary, adhesion coatings, separation coatings or color coatings may be provided between the photosensitive coating and base or covering sheets. A change in the adhesion with respect to the base sheet or covering sheet or the coating situated in between and the cohesion inside the photosensitive coating is brought about by the exposure, with the result that an imagewise separation takes place within the photosensitive coating as a result of utilizing the adhesion differences or cohesion differences when pulling the sheets apart. A clean separation of the exposed or unexposed coating areas, respectively, from the sheet which adheres less in each case is made possible by the fact that the sheets have relatively smooth surfaces.

The production of offset printing plates by this method presents more problems since the nonimage areas have to be peeled off the surface of the printing plate base which is usually a grained and optionally anodized aluminum plate. Here even the smallest residues of the oleophilic photosensitive coating remaining in the rough, porous base surface would hamper the usability since they result in scumming in the nonimage areas. The replacement of the base by a material having a smooth surface is not readily possible since the structured hydrophilic surface of the base is necessary for the water distribution in offset printing.

DE-A 27 25 762 describes photosensitive printing plates which are processed by peel-apart development. The materials have, between the printing-plate base and the photosensitive photopolymerizable coating, a hydrophilic intermediate coating composed, for example, of a water-soluble silicate. As a result of this, an improvement in the coating separation is achieved during development, that is to say, a good differentiation between oleophilic and hydrophilic areas on the surface of the printing plate. The strongly hydrophilic nature of the intermediate coating, however, renders it capable of attack by aqueous solutions, with the result that the image elements of the oleophilic image coating are scored and attacked in the course of the printing process or may even be stripped from the base completely. Satisfactory print runs cannot therefore be achieved.

EP-A 530 674 describes a similar material which contains an intermediate coating composed of a hydrophilic polymer, for example, polyvinylalcohol, and a polymerizable compound between the printing-plate base and the photopolymerizable image coating. During the exposure, the polymerizable compound takes part in the polymerization of the photopolymerizable coating and ensures an increased adhesion between these coatings. If the intermediate coating is composed only of polymer and polymerizable compound, said compound polymerizes essentially only at the interface with the photopolymerizable coating. Since the intermediate coating has a thickness of, preferably, 5 to 30 µm, most of this coating remains unpolymerized and, consequently, water-soluble. It is therefore strongly attacked by the damping water in the areas of the smaller screen dots during printing and cannot yield long print runs. It is in fact possible for the intermediate coating to be cured thermally or photochemically; however, in the latter case, there is the risk that the coating becomes oleophilic in the non-image areas, in particular if the water-soluble polymer is washed out of the cured coating in the course of the printing. That results in scumming and to reduction of the print run.

WO-A 93/5446 describes a material which is similar to that described above, but contains a hydrophilic photopolymerizable intermediate coating having a relatively high proportion of monomers and of photoinitiator. In this case, the intermediate coating is again subject to the risk of an unintentional partial polymerization if it is handled in daylight during processing after the image exposure. Under these circumstances, a polymerization and, consequently, oleophilization in the nonimage areas, which result in scumming, may readily occur in the absence of special precautionary measures. This coating is therefore washed out prior to printing, preferably with water or damping water.

SUMMARY OF THE INVENTION

One object of the present invention is to provide a negative-working photosensitive material for the production of offset printing plates which can be processed, without using liquid developers, to produce an offset printing plate having high printing capacity and low tendency to scumming and which does not require any further processing steps apart from image exposure and peel-apart development.

Another object of the invention is to provide a method of producing offset printing forms having the desired advantages described above.

In accordance with these objects, there has been provided a photosensitive material for the production of offset printing plates comprising in the recited order, a) a coating base suitable for offset printing comprising aluminum or aluminum alloy, b) a hydrophilic coating having a coating weight in the range from 0.001 to 1 g/m² comprising an organic polymer and a free-radical-polymerizable compound, c) a photopolymerizable coating comprising
   (1) a polymeric binder,
   (2) a free-radical-polymerizable compound, and
   (3) a compound or a combination of compounds which is capable of initiating the polymerization of the compound (2) on exposure to actinic radiation, and d) a transparent covering sheet, wherein the adhesion of the photopolymerizable coating (c) to one or both of the hydrophilic coating (b) and the covering sheet (d) is altered by exposure.

In accordance with these objects, there has also been provided a method of producing an offset printing form, which comprises imagewise exposing a photosensitive material of claim 1 through the covering sheet (d) and developing it by peeling the covering sheet off the coating base (a).

Further objects, features, and advantages of the invention will become apparent from the detailed description of preferred embodiments which follows.

DETAILED DESCRIPTION OF THE PREFERRED EMBODIMENTS

The organic hydrophilic polymer forming the main constituent of the hydrophilic coating (b) may be any such polymer or mixture of polymers, and is usually water-soluble. Suitable polymers are described, for example, by C. L. McCormick, J. Bock and D. N. Schulz in *Encyclopedia of Polymer Science and Engineering* 17, 730 (1985), which is hereby incorporated by reference. Natural and synthetic hydrophilic polymers such as nucleotides, polypeptides, polysaccharides, poly(meth)acrylamides, poly(meth)acrylic acids, polyethylene oxides, polyvinyl alcohols, polyvinylpyrrolidones, their copolymers or water-soluble derivatives of these or other polymers, for example, cellulose ether, obtained by grafting or analogous polymer reactions, are generally suitable. Ionizable substances such as polyamines, polyimines, polyvinylpyridines, polysulfonic or polyphosphonic acids may also be used. Furthermore, amphoteric polymers, for example, the acrylate copolymers described in DE-A 40 23 269 and 40 23 268, both of which are incorporated by reference, are also suitable.

As a further constituent of the hydrophilic coating, the coating contains a free-radical-polymerizable compound generally in a smaller amount than the organic polymer. Any such compound or compounds can be used. The compound usually contains one or, preferably, two or more, polymerizable ethylenic double bonds. Suitable compounds, in particular, include hydrophilic esters or amides of (meth) acrylic, maleic, fumaric or vinylphosphonic acid. In particular, esters of acrylic or methacrylic acid formed with polyhydric aliphatic alcohols, for example, glycols, oligoglycols, glycerol, diglycerol, trimethylolethane, trimethylolpropane, pentaerythritol, and dipentaerythritol, which are preferably only partially esterified and optionally extended by reaction with ethylene glycol or propylene glycol can advantageously be used. Amides of the said unsaturated acids and corresponding derivatives of multifunctional compounds such as aminoalcohols, hydroxycarboxylic acid and the like are also suitable.

The proportion by weight in the hydrophilic coating, of polymers is preferably between 50 and 95%, preferably between 55 and 80%, and that of polymerizable compound preferably between 5 and 50%, particularly preferably between 20 and 45% by weight of the hydrophilic coating. The proportions can be varied to give desired results. The coating (b) may furthermore contain dyes, surfactants, leveling agents, release agents, waxes, pigments, UV absorbers, and other standard additives.

The coating weight of the hydrophilic coating (b) is preferably 0.01 to 1 g/m², particularly preferably 0.05 to 0.7 g/m². This means, the thickness of the coating layer (b) is at most about 1 µm.

The photopolymerizable coating (c) is composed of an oleophilic mixture which contains a polymeric binder (1), a free-radical-polymerizable compound (2) and a polymerization initiator (3) which can be activated by radiation, in particular light.

The polymeric binder (1) should be compatible with the other constituents of the photopolymerizable coating, i.e., a phase separation within the coating must not occur over the entire production and application temperature range. Furthermore, it is preferred for the unexposed coating areas to have a higher adhesion to the covering sheet (d) than to the hydrophilic coating (b) in the coating base (a). Conversely, the exposed areas should adhere more strongly to the hydrophilic coating (b) on the coating base (a) than to the covering sheet (d). Also, as smooth and sharp a separation as possible of the exposed coating areas from the unexposed coating areas should take place within the coating.

A high affinity for printing ink and chemical and mechanical stability within the printing process are also concomitantly determined by the binder. Examples of suitable polymers include chlorinated polyolefins, for example, chlorinated polyethylenes and chlorinated polypropylenes, poly(meth)acrylic acid esters, polyacrylonitrile, polystyrene, poly(vinyl chloride), poly(vinylidene chloride), polybutadiene, polyisoprene, polychloroprene, chlorinated natural rubbers, poly(vinyl acetates), poly(vinyl acetals), polyesters, polyamides and polyurethanes, and also the copolymers of the monomers forming the bases of these polymers. Preferably used are chlorinated natural rubbers, poly(meth)acrylates and their copolymers and polyamides. Also preferably used are representatives of the class of the poly(vinyl acetals), particularly the poly(vinyl butyrals). The proportion of binder in the photopolymer coating may be varied to obtain desired results and generally varies between 10 and 90, more preferably, between 70 and 30%, based in each case on the weight of the nonvolatile constituents.

The free-radical-polymerizable compound (2) may be any such compound or mixtures of such compounds, and is generally an ethylenically unsaturated substance or a corresponding mixture of substances. Suitable such compounds include esters or amides of acrylic, methacrylic, fumaric or maleic acid. Preferred are compounds containing more than one polymerizable double bond, for example, the esters of the said acids formed with alkanediols, poly/oligo(ethylene glycols), poly/oligo(propylene glycols), poly/oligo(butylene glycols) and other bifunctional low-molecular-weight or high-molecular-weight organic diols. Particularly suitable are the esters of polyhydric alcohols such as glycerol, trimethylolethane or trimethylolpropane, pentaerythritol, isocyanuric acid, its ethoxylated or propoxylated derivatives, and dimers or oligomers of these compounds. In this connection, as high a degree of esterification as possible is advantageous. Also usable are amides, for example, the compounds which are formally produced during the reaction of ethylenediamine or its oligomers with the acids described. The proportion by weight of the monomers depends on desired results, and is approximately 5 to 80%, preferably approximately 10 to 60% by weight of the nonvolatile constituents.

Depending on the desired sensitization range, various materials are used as compounds or combinations of compounds which are capable of initiating the polymerization of the compound (2) on exposure to actinic radiation, in particular visible or UV light, that is to say in particular photoinitiators (3). If the photosensitive material is to be sensitive to the near UV range (350–420 nm) which is standard in offset printing, other photoinitiator systems are used than those used if exposure is to be carried out in the visible spectral range, for example, with laser radiation.

The photoinitiators to be exposed in the near UV range should absorb light in the range between approximately 250 and 500 nm with the formation of free radicals. Examples are acyloins and their derivatives such as benzoin, benzoin alkyl ethers, vicinal diketones and their derivatives, for example, benzil, benzil acetals such as benzil dimethyl ketal, fluorenones, thioxanthones, polycyclic quinones, acridines, quinoxalines, and furthermore trichloromethyl-s-triazines, 2-halomethyl-4-vinyl-1,3,4-oxadiazole derivatives, halooxazoles substituted with trichloromethyl groups, carbonylmethyleneheterocyclics containing trihalomethyl groups and acylphosphine oxide compounds. The photoinitiators can also be used in combination with one another or with coinitiators or activators, for example, with Michler's ketone and its derivatives or 2-alkylanthraquinones.

In the case of the photoinitiators used particularly for laser irradiation in the visible range, mixtures of metallocenes, photoreducible dyes, photolytically clearable compounds containing trihalomethyl groups and optionally further initiator constituents and dye constituents, such as those described in EP-A 364 735, which is incorporated by reference, are generally suitable. The metallocene component is composed of variously substituted cyclopentadienyl complexes of titanium or zirconium. Xanthene, benzoxanthene, benzothioxanthene, thiazine, pyronine, porphyrin and acridine dyes may be used as photoreducible dyes. In the case of the trihalomethyl coinitiators, the known triazine derivatives containing bromine or chlorine as halogen, in particular, have proven advantageous. Further initiator constituents are compounds which increase the sensitivity, in particular, in the near UV range, for example, acridine, phenazine or quinoxaline derivatives, or bring about an increase in sensitivity in the visible range, for example, dibenzalacetones or coumarins.

The amount of the photoinitiator or of the initiator combination is an effective amount to achieve desired results and is generally approximately 0.1 to 15% by weight, preferably approximately 0.5 to 10% by weight of the nonvolatile coating constituents.

In addition, the photopolymerizable coating (c) may contain stabilizers for suppressing thermal polymerization, pigments, dyes, plasticizers, or other auxiliaries for improving the mechanical or reprographic quality. In this connection, care should be taken to ensure that the substances added do not absorb an excessive proportion of the actinic light needed for the polymerization and thereby reduce the practical photosensitivity.

The coating thickness of the photopolymerizable coating (c) expressed as the coating weight may be varied and is generally 0.1 to 10 g/m², preferably 0.5 to 5.0 g/m².

Any desired sheet can be used as transparent covering sheet (d). Suitable, in particular, as flexible transparent covering sheets (d) for the material according to the invention are those plastics sheets which are dimensionally stable when heated to approximately 60° to 130° C. Suitable for this purpose are, for example, sheets composed of cellulose acetate, polyethylene, polypropylene, polystyrene, polyamides, polycarbonates, polyesters and polyimides. Preferably, the sheet should have low permeability to atmospheric oxygen. For this reason, sheets composed of polyesters, polycarbonates, polyimides and similar polymers are preferably used; polyester sheets are generally preferred.

The covering sheet may have any desired thickness, with the thickness generally in the range from about 5 to 100 µm preferably, 12 to 50 µm. To improve the dimensional stability, the sheets are generally biaxially stretched and optionally heat-set.

To improve the adhesion of the photopolymerizable coating (c) the surface may be subjected to a treatment which increases the adhesion, for example, by corona discharge, by etching with chemicals, for example, trichloroacetic acid, and by coating with an adhesion-promoting coating. Such coatings are generally 0.001 to 0.1 µm thick. They may comprise copolymers of (meth)acrylic acid esters, such as those described, for example, in U.S. Pat. No. 4,098,952, which is incorporated by reference, and are preferably crosslinked. Suitable sheets are described in U.S. Pat. No. 5,049,476, which is incorporated by reference.

The surface of the sheet may also be subjected to a blocking-preventing treatment, for example, by applying a suitable coating containing finely divided organic or, in particular, inorganic particles, whose size, amount and refractive index are so dimensioned that the transparency of the sheet is not impaired. This is to prevent that adhesion forces cause a blocking of the master-sheet placed onto the recording material, the master-sheet which then may be moved into the right position only by fits and starts. The surface may be smooth or matted. Suitable sheets are described, for example, in EP-A 130 222, hereby incorporated by reference.

The coating base (a) is an aluminum plate which is standard as base material for offset printing plates and has a hydrophilic surface. The aluminum may in general contain fairly small amounts of iron, silicon, manganese, zinc, titanium, copper and the like as alloy constituents. The aluminum is preferably superficially grained and anodized. The surface may also have been treated in a known manner with alkali-metal silicates, phosphates, hexafluorozirconates, polyvinylphosphonic acid or other standard pretreatment agents. The thickness of the coating base may be selected as desired, and is generally between 0.05 and 1 mm, preferably between 0.1 and 0.5 mm.

The photosensitive material may be produced in any desired manner. Generally, the photosensitive material is produced by dissolving the constituents of the hydrophilic coating (b) in a suitable solvent, generally water or a mixture of water and organic solvents miscible therewith, such as low alkanols, acetone or the like, and applying the solution to the surface of the coating base (a) in such a way that the desired coating thickness is obtained after drying. The photopolymerizable coating (c) is then generally also applied to the dried interlayer by coating from a solution. In this connection, the solvent is chosen so that the hydrophilic interlayer (b) is not incipiently dissolved. The covering sheet (d) is then applied to the photopolymerizable coating (c) by lamination. The lamination may be carried out at room temperature or at elevated temperature.

The photopolymerizable coating may also be applied to the covering sheet by coating from a solution, dried thereon and then applied to the coating base (a) coated with the hydrophilic coating (b) by lamination. This lamination operation can also be carried out at a later time after storage of the elements comprising (a)+(b) and (c)+(d). In this case, however, it is expedient to cover the bare side of the photopolymerizable coating (c) with a separable protective sheet, for example, composed of polyethylene, which is then pulled off only immediately prior to the lamination.

An offset printing form is produced from the photosensitive material in any desired manner. Generally, the photosensitive material obtained is imagewise exposed through the transparent covering sheet (d) in a known manner. The exposure may be carried out by means of a suitably controlled radiation source, for example, a laser, or in contact under a transparent master. As a result of the imagewise crosslinking of the photopolymerizable coating (c) its adhesion with respect to the covering sheet (d) and/or the hydrophilic interlayer (b) is altered in such a way that, when the covering sheet is peeled off, only the unexposed coating areas are removed with it. In this process, a negative image is left on the coating base (a). Since the adhesion of the photopolymerizable coating with respect to the rough surface of the coating base (a), which is not planarized by the relatively thin hydrophilic coating (b), is generally stronger than with respect to the transparent covering sheet (d), said sheet should generally undergo an adhesion-enhancing surface treatment, as described above.

After the development of the image, the image left on the coating base may be postcured thermally or by irradiation or exposure in a manner known per se to increase the print-run stability.

The material and method according to the invention achieve the result that offset printing plates are obtained by a processing for which no liquid developer or other processing solutions are necessary. Compared with known methods of this type, the method according to the invention has the advantage that it yields printing plates with a markedly higher run stability.

The following examples explain preferred embodiments of the invention. The examples illustrate the invention, but do not limit it. Unless otherwise stated, quantitative ratios and percentages are to be understood in units of weight. The amounts are generally specified in parts by weight (pbw).

EXAMPLE 1 a) A solution of the composition specified below was applied to a 50 μm thick biaxially stretched and heat-set poly(ethylene terephthalate) sheet (Melinex® 505, ICI) whose surfaces had been pretreated on both sides to improve adhesion:

2.36 pbw of poly(ethyl methacrylate) (Tg 65° C., acid number 8, viscosity 300 mPa·s in 37.5%-strength solution in toluene at 25° C.), 0.05 pbw of poly(methyl methacrylate) (Tg 105° C., acid number<1), 2.15 pbw of trimethylolpropane triacrylate, 0.08 pbw of 2-benzyl-2-dimethylamino-1-(4-morpholinophenyl)-1-butanone, 0.25 pbw of Renol blue B2G (C. I. 74 160), 0.09 pbw of 4-diethylamino-4'-methoxydibenzalacetone and 0.03 pbw of 2,6-di-tert-butyl-4-methylphenol in 49.8 pbw of butanone, 2.5 pbw of tetrahydrofuran, 35.6 pbw of propylene glycol monomethyl ether and 7.13 pbw of γ-butyrolactone.

After drying, the coating weight was 1.91 g/m².

b) A 0.3 mm thick electrolytically grained and anodized aluminum plate having an oxide coating weight of 3.6 g/m² was aftertreated with a 0.1%-strength aqueous poly (vinylphosphonic acid) solution. An aqueous solution of 0.7% of a partially saponified polyethylene glycol/vinyl acetate graft polymer having an ester number of 150, 0.3% of polyethylene glycol (400) dimethacrylate and 0.001% of hydroquinone monomethyl ether was spun onto this coating base in such a way that a coating weight of 0.1 g/m² was obtained after drying.

c) The photopolymerizable material described under (a) was laminated under pressure onto the coating base described under (b) at 90° C. The photosensitive printing plate obtained was contact-exposed under a test master for 12 seconds using a 5 kW metal-halide lamp at a spacing of 110 cm. The polyester sheet was then peeled off manually, the unexposed coating areas being cleanly removed with the sheet and the exposed coating areas remaining behind together with the cured poly(vinyl alcohol) coating on the aluminum plate as a negative copy having good resolution. The negative image was afterexposed for 100 seconds without master and treated in an ultrasonic bath with water (1), with a 1%-strength aqueous poly(ethylene glycol (300) nonylphenyl ether) solution (2) and a 1%-strength sodium dodecylbenzenesulfonate solution (3) for 20 minutes in each case to test the resistance to washing-out. In no case were the image areas attacked or underwashed during this treatment. In a plurality of trials, 40,000 to 50,000 impressions of constant quality were achieved on a commercial offset printing press.

COMPARISON EXAMPLE 1

As in Example 1, an aluminum plate was coated with a 1%-strength solution in water of the graft polymer specified in Example 1. After drying, the coating weight was 0.1 g/m². The photopolymerizable material produced in accordance with Example 1(a) was laminated onto the coated aluminum plate as described under 1(c), exposed and developed by peeling off the polyester sheet. The printing plate obtained remained stable during ultrasonic treatment in water, but was underrinsed slightly in solution (2) and somewhat more strongly in solution (3), which was revealed by underwashing and stripping of individual image elements. Under the same printing conditions as in Example 1, only 8,000 to 10,000 impressions of constant quality were obtained.

EXAMPLE 2

A photosensitive printing plate was produced and processed as described in Example 1. On the aluminum plate, however, the poly(ethylene glycol dimethacrylate) in the interlayer was replaced by triethylene glycol dimethacrylate. The result of the resistance test is stated in Table 1.

EXAMPLE 3

A photosensitive printing plate was produced and processed as described in Example 1, the monomer in the interlayer being replaced, however, by methacrylic acid and 0.01% of p-toluenesulfonic acid additionally being added to this coating solution. The result of the resistance test is stated in Table 1.

COMPARISON EXAMPLE 2

A photosensitive printing plate was produced and processed as described in Example 1. In this case, the aluminum plate was coated with a 1%-strength solution of a 98.4%-hydrolyzed poly(vinyl acetate) having a K-value of 4 in such a way that a coating weight of 0.1 g/m² was obtained after drying. The result of the resistance test is stated in Table 1.

TABLE 1

| Example | Solution 1 | Solution 2 | Solution 3 |
|---|---|---|---|
| 2 | ++ | ++ | ++ |
| 3 | ++ | ++ | ++ |
| C2 | ++ | − | − |

— = image elements severely damaged
− = image elements markedly damaged
0 = image elements lightly damaged
+ = image elements slightly damaged
++ image elements undamaged
C = comparison example

EXAMPLES 4–10

Various photosensitive printing plates were produced and processed as described in Example 1. The composition of the photosensitive coatings and their coating weights are stated in Table 2.

After exposure and after pulling off the polyester sheet manually, clean negative images which had good resolution and are stable with respect to the action of a mixture of printing ink and damping solution were left on the aluminum plates.

tion and which are absolutely rub-proof with respect to a damping solution/printing ink mixture and are inked without background (tone) were left on the aluminum plate.

TABLE 3

| Example | Polymer | Coating weight |
|---|---|---|
| 11 | A: N-vinyl-N-methyl-acetamide/bis(2-ethylhexyl)maleate copolymer | 0.32 |
| 12 | B: polyvinylpyrrolidone; K-value 90–103 | 0.19 |
| 13 | C + D 1:1 | 0.16 |
|  | C: polyvinylpyrrolidone; K-value 11–14; used as 50% strength solution in $H_2O$ |  |
|  | D: polyethylene oxide ($M_w$ = 400,000) |  |
| 14 | C + E 3:7 | 0.018 |
|  | E: polyethylene oxide ($M_w$ = 300,000) |  |
| 15 | F: polyethylene imine (50%-strength aqueous solution) (viscosity 17,000–28,000 mPa·s at 20° C.) | 0.15 |

EXAMPLE 16

A photosensitive printing plate was produced as described in Example 1 by coating with the following solution:

2.98 pbw of poly(ethyl methacrylate) as in Example 1, 0.746 pbw of poly(ethyl methacrylate) (Tg=63° C., acid number=0; viscosity 7500 mPa·s in 37.5%-strength solution in toluene at 25° C.),

TABLE 2

| Ex. | Constituent | Parts by weight | | | | | Coating weight (g/m²) |
|---|---|---|---|---|---|---|---|
| 4 | Poly(vinyl acetate)[1] | 1.825 | | | | | 1.69 |
| 5 | Vinyl acetate/crotonic acid copolymer[2] | | 1.825 | | | | 1.39 |
| 6 | Vinyl acetate/vinyl chloride copolymer[3] | | | 1.825 | | | 1.75 |
| 7 | Ethyl acrylate terpolymer[4] | | | | 1.825 | | 1.57 |
| 8 | Ethyl acrylate terpolymer[5] | | | | | 1.825 | 1.92 |
| 9 | Chlorinated natural rubber[6] | | | | | 1.825 | 0.95 |
| 10 | Vinyl acetate/Di-n-butylmaleate copolymer[7] | | | | | | 1.825 1.32 |
|  | Pentaerythritol tetraacrylate | 2.875 | | | | | |
|  | 2-Benzyl-2-dimethylamino-1-(4-morpholinophenyl)-1-butanone | 0.075 | | | | | |
|  | Renol blue B2G (C.I. 74160) | 0.200 | | | | | |
|  | 2,6-Di-tert-butyl-4-methylphenol | 0.025 | | | | | |
|  | Dissolved in: tetrahydrofuran | 52.24 | | | | | |
|  | propylene glycol monomethyl ether | 35.63 | | | | | |
|  | γ-Butyrolactone | 7.13 | | | | | |

[1] Viscosity 25 mPa·s, 20%-strength solution in ethyl acetate at 20° C.; DIN/ISO 4625 softening range: 105–120° C.; acid number 1–2
[2] 95% vinyl acetate, 5% crotonic acid, softening range: 100–120° C., acid number 35–45
[3] DIN 53177 dynamic viscosity at 20° C.: 30–60 mPa·s acid number <10
[4] Ethyl acrylate/methyl methacrylate/acrylic acid (40:50:10) $T_g$ = 50° C., acid number = 80
[5] Ethyl acrylate/methyl methacrylate/acrylic acid (26:62:12) $T_g$ = 70° C., acid number = 100
[6] Parlon S 5 (Hercules)
[7] Softening range: 80–100° C., acid number <1.5

EXAMPLES 11–15

Various photosensitive printing plates were produced and processed analogously to Example 1, but the partially saponified poly(ethylene glycol)/vinyl acetate graft polymer in the hydrophilic, free-radical-polymerizable coating was replaced by one of, or a mixture of, polymers A to F. The polymers and the coating weights of the hydrophilic coatings are stated in Table 3.

After exposure and after peeling off the polyester sheet manually, sharp negative images which have good resolu- 0.14 pbw of poly(methyl methacrylate) as in Example 1, 2.46 pbw of pentaerythritol tetraacrylate, 0.203 pbw of biscyclopentadienylbis[2,6-difluoro-3-(1-pyrryl)phenyl]titanium, 0.035 pbw of 2,6-di-tert-butyl-4-methylphenol, 0.175 pbw of Renol blue B2G (C.I. 74 160), 0.028 pbw of 2-(p-styrylphenyl)-4,6-bistrichloromethyl-s-triazine and 0.322 pbw of alcohol-soluble eosin (C.I. 45 386) in 51.2 pbw of butanone, 34.9 pbw of propylene glycol monomethyl ether and 6.98 pbw of γ-butyrolactone.

After drying, the coating weight was 1.71 g/m². The printing plate produced in accordance with Example 1 yielded, after exposure for 5 s using a 500 W incandescent lamp (spacing 110 cm) and manual peeling, a sharp negative printing form which is absolutely rub-proof with respect to the mechanical action of a mixture of printing ink and damping solution and was correctly inked by the latter.

EXAMPLE 17

A photosensitive printing plate was produced analogously to Example 1 by coating with the following solution:

84.0 pbw of poly(ethyl methacrylate) as in Example 1, 96.0 pbw of pentaerythritol tetraethoxy tetraacrylate, 3.00 pbw of 2-benzyl-2-dimethylamino-1-(4-morpholinophenyl)-1-butanone, 15.0 pbw of Hostaperm blue B2G (C.I. 74 160), 1.00 pbw of 2,6-di-tert-butyl-4-methylphenol and 1.00 pbw of silicone oil (Edaplan LA 411) in 990 pbw of butanone, 675 pbw of propylene glycol monomethyl ether, 135 pbw of 7-butyrolactone.

A coating weight of 1.32 g/m² resulted after drying.

A stock solution was prepared using 80.0 pbw of the poly(ethylene glycol)/vinyl acetate graft polymer in accordance with Example 1, 20.0 pbw of hydroxyethyl methacrylate, 240 pbw of water and 160 pbw of propylene glycol monomethyl ether. The stock solution was then diluted to the following contents of nonvolatile constituents using a solvent mixture composed of water and propylene glycol monomethyl ether (ratio 3:2):

| | |
|---|---|
| a) | Stock solution (20%) |
| b) | 15% |
| c) | 10% |
| d) | 5% |
| e) | 3% |
| f) | 2% |
| g) | 1% | and applied in each case to an Al plate. The coating weights obtained after drying at 100° C. are listed in Table 4.

The printing plates were exposed and developed by peeling off the polyester sheet by hand as described in Example 1. The image quality obtained as a function of the thickness of the hydrophilic coating is stated in Table 4, together with the rub-proofness with respect to a damping solution/printing ink mixture and the results of an under-rinsing test involving ultrasonic treatment for 20 min in water.

It is intended that the specification be considered as exemplary only. Other embodiments of the invention will be apparent to those skilled in the art from consideration of the specification and practice of the invention disclosed herein.

TABLE 4

| Experiment No. | Coating weight | Image quality | Rub-proofness | Ultrasonic test |
|---|---|---|---|---|
| a | 19.93 | very poor | — | — |
| b | 9.68 | poor | — | — |
| c | 4.16 | average | – | – |
| d | 0.99 | very good | 0 | 0 |

TABLE 4-continued

| Experiment No. | Coating weight | Image quality | Rub-proofness | Ultrasonic test |
|---|---|---|---|---|
| e | 0.41 | good | ++ | ++ |
| f | 0.18 | good | ++ | ++ |
| g | 0.03 | average | ++ | ++ |

Assessment according to Table 1.

What is claimed is:

1. A photosensitive material for the production of offset printing plates comprising adhered to one another in the recited order
   a) a coating base suitable for offset printing comprising aluminum or aluminum alloy,
   b) a hydrophilic coating having a coating weight in the range from 0.001 to 1 g/m² consisting essentially of an organic polymer and a free-radical-polymerizable compound,
   c) a photopolymerizable coating comprising
      (1) a polymeric binder,
      (2) a free-radical-polymerizable compound and
      (3) a compound or a combination of compounds which is capable of initiating the polymerization of the compound (2) on exposure to actinic radiation, and
   d) a transparent covering sheet,
   wherein the adhesion of the photopolymerizable coating (c) to one or both of the hydrophilic coating (b) and the covering sheet (d) is altered by exposure to actinic radiation.

2. A photosensitive material as claimed in claim 1, wherein the photopolymerizable coating (c) has a coating weight in the range from 0.1 to 10 g/m².

3. A photosensitive material as claimed in claim 1, wherein the polymeric binder (1) in the coating (c) is oleophilic.

4. A photosensitive material as claimed in claim 1, wherein the free-radical-polymerizable compound (2) in the coating (c) contains at least two ethylenically unsaturated, polymerizable groups.

5. A photosensitive material as claimed in claim 1, wherein the photopolymerizable coating (c) comprises 10 to 90% by weight of binder (1), 5 to 80% by weight of polymerizable compound (2), and 0.1 to 15% by weight of radiation-activable polymerization initiator (3), based on the weight of the nonvolatile constituents in the coating.

6. A photosensitive material as claimed in claim 1, wherein the surface of the coating base (a) is mechanically, chemically, or electrolytically grained and anodized.

7. A photosensitive material as claimed in claim 1, wherein the free-radical polymerizable compound of the hydrophilic coating (b) contains at least two polymerizable ethylenic double bonds.

8. A photosensitive material as claimed in claim 1, wherein the hydrophilic coating (b) comprises 50–95% by weight of the organic polymers and 5–50% by weight of the free-radical-polymerizable compound, based on the weight of the coating.

9. A photosensitive material as claimed in claim 1, wherein the covering sheet (d) contains an adhesive-promoting coating to improve adhesion to the photopolymerizable coating (c).

10. A photosensitive material as claimed in claim 1, wherein the hydrophilic coating has a coating weight of from 0.05 to 0.7 g/m².

11. A photosensitive material as claimed in claim 1, wherein the hydrophilic coating has a thickness of at most 1 μm.

12. A photosensitive material as claimed in claim 1, wherein the hydrophilic coating (b) comprises 55–80% by weight of the organic polymer and 20–45% by weight of the free-radical-polymerizable compound, based on the weight of the coating.

13. A method of producing an offset printing form, which comprises imagewise exposing a photosensitive material of claim 1 through the covering sheet (d) and developing the exposed material by peeling the covering sheet off the coating base (a).

14. A method as claimed in claim 13, wherein the offset printing form obtained is postcured after development by heating or irradiation.

* * * * *